(12) United States Patent
Lille

(10) Patent No.: US 7,621,038 B2
(45) Date of Patent: Nov. 24, 2009

(54) METHOD FOR FABRICATING A THREE TERMINAL MAGNETIC SENSOR FOR MAGNETIC HEADS WITH A SEMICONDUCTOR JUNCTION

(75) Inventor: Jeffrey S. Lille, Sunnyvale, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 27 days.

(21) Appl. No.: 12/009,427

(22) Filed: Jan. 17, 2008

(65) Prior Publication Data
US 2008/0151440 A1   Jun. 26, 2008

Related U.S. Application Data

(62) Division of application No. 10/902,995, filed on Jul. 30, 2004, now Pat. No. 7,349,185.

(51) Int. Cl.
G11B 5/127 (2006.01)
H04R 31/00 (2006.01)

(52) U.S. Cl. ............... 29/603.14; 29/603.07; 29/603.13; 360/324.1; 360/324.2; 427/127; 427/128

(58) Field of Classification Search ............ 29/603.07, 29/603.12, 603.15, 603.16, 603.18, 606; 205/119, 122; 360/324.1, 324.2; 427/127, 427/128
See application file for complete search history.

(56) References Cited

U.S. PATENT DOCUMENTS

| 5,416,353 A | 5/1995 | Kamiguchi et al. |
| 5,432,373 A | 7/1995 | Johnson |
| 5,654,566 A | 8/1997 | Johnson |
| 5,691,865 A | 11/1997 | Johnson et al. |
| 5,747,859 A | 5/1998 | Mizushima et al. |
| 5,962,905 A | 10/1999 | Kamiguchi et al. |
| 6,064,552 A | 5/2000 | Iwasaki et al. |
| 6,163,437 A * | 12/2000 | Inage et al. .................. 360/128 |
| 6,201,259 B1 | 3/2001 | Sato et al. |
| 6,218,718 B1 | 4/2001 | Gregg et al. |

(Continued)

FOREIGN PATENT DOCUMENTS

JP         10074308        3/1998

(Continued)

OTHER PUBLICATIONS

D.J. Monsma et al.; Physical Review Letters, vol. 74 No. 26, "Perpendicular Hot Electron Spin-Valve Effect in a New Magnetic Field Sensor: The Spin-Valve Transistor" Jun. 26, 1995.

(Continued)

*Primary Examiner*—Paul D Kim
(74) *Attorney, Agent, or Firm*—Zilka-Kotab, PC

(57) ABSTRACT

A method for fabricating a three terminal magnetic (TTM) sensor of a magnetic head according to one embodiment includes fabricating a P-type semiconductor material; fabricating an N-type semiconductor material at an upper surface of a portion of said P-type semiconductor material; fabricating a spin valve structure upon said N-type semiconductor material; engaging a collector lead to said P-type semiconductor material; engaging a base lead to said N-type semiconductor material; and engaging an emitter lead to said spin valve structure.

3 Claims, 4 Drawing Sheets

U.S. PATENT DOCUMENTS

| | | |
|---|---|---|
| 6,480,365 B1 | 11/2002 | Gill et al. |
| 6,501,143 B2 | 12/2002 | Sato et al. |
| 6,577,476 B1 | 6/2003 | Childress et al. |
| 6,873,009 B2 * | 3/2005 | Hisamoto et al. ........... 257/329 |
| 6,876,511 B2 * | 4/2005 | Koyanagi ..................... 360/75 |
| 2003/0214763 A1 | 11/2003 | Childress et al. |

FOREIGN PATENT DOCUMENTS

| | | |
|---|---|---|
| JP | 10206513 | 8/1998 |
| JP | 2000332317 | 11/2000 |
| JP | 2001094172 | 4/2001 |
| JP | 2002289943 | 10/2002 |

OTHER PUBLICATIONS

Mark Tondra et al.; Web paper, "Magnetoresistive Characteristics of Schttky—Tunnel Hot Electron Spin Transistors", web date Feb. 14, 2000; http/www.nve.com/adv.pdf/paper.pdf.

R. Jansen; Journal of Physics D; Applied Physics 36 (2003) R289-R308;Topical Review, The spin-valve transistor: a review and outlook Published Sep. 17, 2003.

* cited by examiner

METHOD FOR FABRICATING A THREE TERMINAL MAGNETIC SENSOR FOR MAGNETIC HEADS WITH A SEMICONDUCTOR JUNCTION

CROSS REFERENCE TO RELATED APPLICATION

This application is a divisional of and claims priority to application Ser. No. 10/902,995, filed Jul. 30, 2004, now U.S. Pat. No. 7,349,185 and entitled THREE TERMINAL MAGNETIC SENSOR FOR MAGNETIC HEADS WITH A SEMICONDUCTOR JUNCTION, by the same inventor, and which is commonly assigned.

BACKGROUND OF THE INVENTION

1. Field of the Invention

The present invention relates generally to three terminal magnetic sensors such as spin valve transistor sensors for magnetic heads, and more particularly to a spin valve transistor sensor in which the base and collector are formed within the semiconductor layers of the sensor.

2. Description of the Prior Art

Magnetic heads for hard disk drives are generally fabricated with a read head portion and a write head portion. Currently, the typical read head portion of such magnetic heads includes a type of spin valve sensor that is referred to as a giant magnetoresistance (GMR) sensor. Such GMR sensors include two electrical signal leads, and changes in electrical resistance of layers within the GMR sensor caused by the presence of magnetic data bits proximate the read head modulate the current of the magnetic head electronic sensor circuit. The fabrication characteristics of such sensors are well known to those skilled in the art.

Efforts to create more sensitive read head sensors have recently lead to the development of three terminal magnetic sensors, such as spin valve transistor (SVT) sensors. In such devices, the components of a typical spin valve sensor are fabricated upon a semiconductor layer, and three electrical leads, emitter, base and collector are utilized. One such SVT sensor for a magnetic head is described in published U.S. Patent Application U.S. 2003/0214763 A1, published Nov. 20, 2003. The SVT sensors described in this published application include configurations in which the semiconductor is connected to the collector lead and components of the spin valve structure are connected to the emitter and base leads. The SVT sensor of the magnetic head of the present invention is fabricated with a different structure.

SUMMARY OF THE INVENTION

The magnetic head of the present invention includes a three terminal magnetic (TTM) sensor, for example, a spin valve transistor (SVT) sensor within its read head. The SVT sensor includes a semiconductor structure and a spin valve structure, where the semiconductor structure includes at least two layers. Two of the three leads of the SVT sensor are engaged to the semiconductor layers, such that a semiconductor junction between the layers is disposed between the two leads. Generally, the junction may comprise a P-N junction between a P-type layer and an N-type layer and in an embodiment of the present invention the collector lead is engaged to the P-type semiconductor layer and the base lead is connected to the N-type semiconductor layer. The spin valve structure is fabricated upon the semiconductor structure and the emitter is engaged to the spin valve structure. In this configuration, a free magnetic layer of the spin valve structure is fabricated upon the semiconductor material, such that a barrier, for example a schottky barrier, is formed between the metallic free magnetic layer material and the semiconductor material. The schottky barrier is thus disposed between the emitter and base leads of the SVT sensor. Various forms of the spin valve structure are contemplated for use with the layered semiconductor structure, including the use of a tunnel barrier layer within the spin valve structure.

It is an advantage of the magnetic head of the present invention that it has an TTM sensor in which two leads are engaged to semiconductor material layers.

It is another advantage of the magnetic head of the present invention that it has an SVT sensor in which the collector and base leads are engaged to P-type and N-type semiconductor material layers respectively.

It is a further advantage of the magnetic head of the present invention that it includes an SVT sensor in which a P-N junction is formed in semiconductor material between the base and collector.

It is yet another advantage of the magnetic head of the present invention that it includes an SVT sensor in which the emitter is connected to a spin valve structure and the base and collector are both connected to semiconductor material structures.

It is yet a further advantage of the magnetic head of the present invention that it includes an SVT sensor wherein a schottky barrier is fabricated between the emitter and base.

It is an advantage of the hard disk drive of the present invention that it includes a magnetic head of the present invention which has an TTM sensor in which two leads are engaged to semiconductor material layers.

It is another advantage of the hard disk drive of the present invention that it includes a magnetic head of the present invention that has an SVT sensor in which the collector and base leads are engaged to P-type and N-type semiconductor material layers respectively.

It is a further advantage of the hard disk drive of the present invention that it includes a magnetic head of the present invention that includes an SVT sensor in which a P-N junction is formed in semiconductor material between the base and collector.

It is yet another advantage of the hard disk drive of the present invention that it includes a magnetic head of the present invention that includes an SVT sensor in which the emitter is connected to a spin valve structure and the base and collector are both connected to semiconductor material structures.

It is yet a further advantage of the hard disk drive of the present invention that it includes a magnetic head of the present invention having an SVT sensor wherein a schottky barrier is fabricated between the emitter and the base.

These and other features and advantages of the present invention will no doubt become apparent to those skilled in the art upon reading the following detailed description which makes reference to the several figures of the drawing.

IN THE DRAWINGS

The following drawings are not made to scale as an actual device, and are provided for illustration of the invention described herein.

DETAILED DESCRIPTION OF THE PREFERRED EMBODIMENTS

Figure 1:
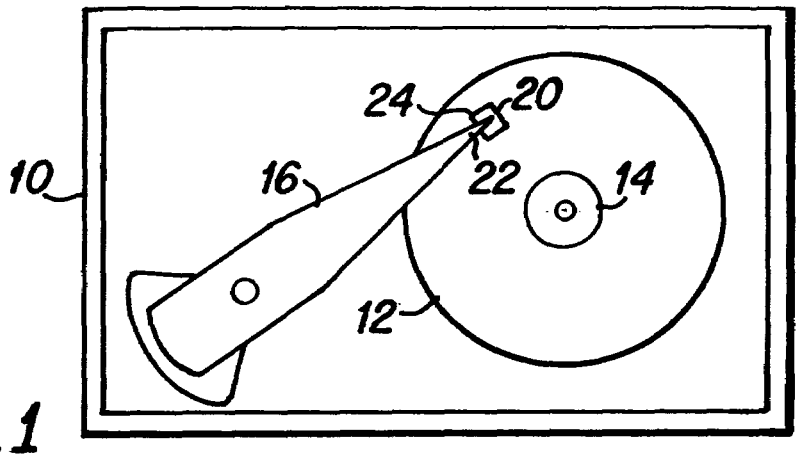
FIG. 1 is a top plan view generally depicting a hard disk drive of the present invention that includes a magnetic head of the present invention.

FIG. 1 is a top plan view that depicts significant components of a hard disk drive which includes the magnetic head of the present invention. The hard disk drive 10 includes a magnetic media hard disk 12 that is rotatably mounted upon a motorized spindle 14. An actuator arm 16 is pivotally mounted within the hard disk drive 10 with a magnetic head 20 of the present invention disposed upon a distal end 22 of the actuator arm 16. The magnetic head 20 is fabricated upon a larger substrate base termed a slider 24. A typical hard disk drive 10 may include a plurality of disks 12 that are rotatably mounted upon the spindle 14 and a plurality of actuator arms 16 having a slider 24 with a magnetic head 20 mounted upon the distal end 22 of each of the actuator arms. As is well known to those skilled in the art, when the hard disk drive 10 is operated, the hard disk 12 rotates upon the spindle 14 and the slider acts as an air bearing that is adapted for flying above the surface of the rotating disk. Such sliders with the magnetic heads are fabricated in large quantities upon a wafer substrate and subsequently sliced into discrete devices 24.

Figure 2:
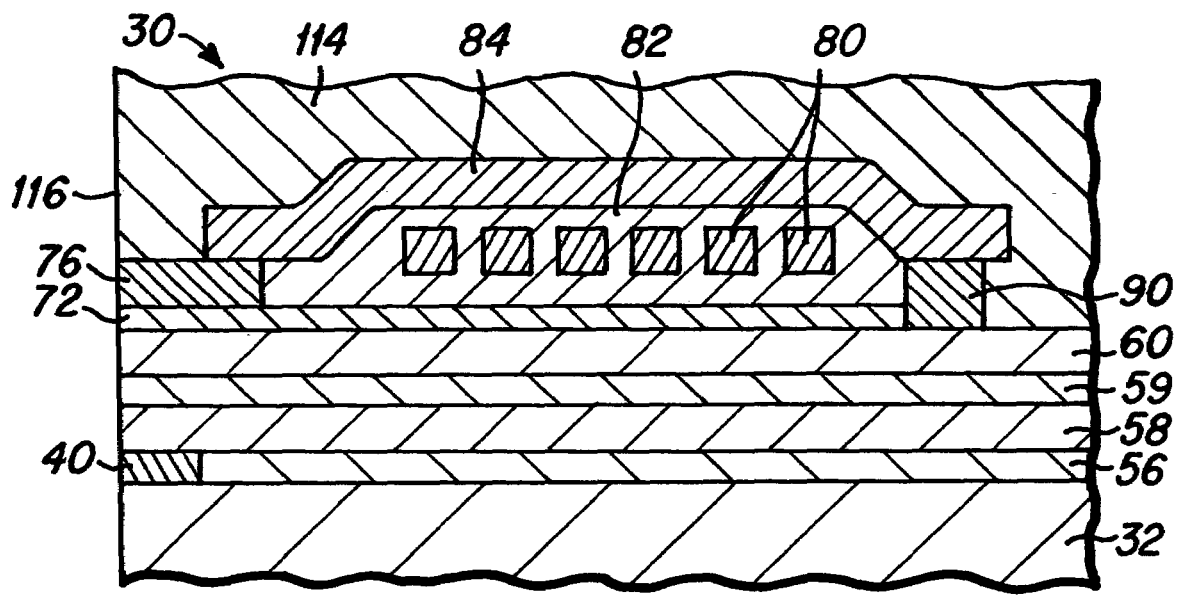
FIG. 2 is a side cross-sectional view depicting a prior art magnetic head.
Figure 3:
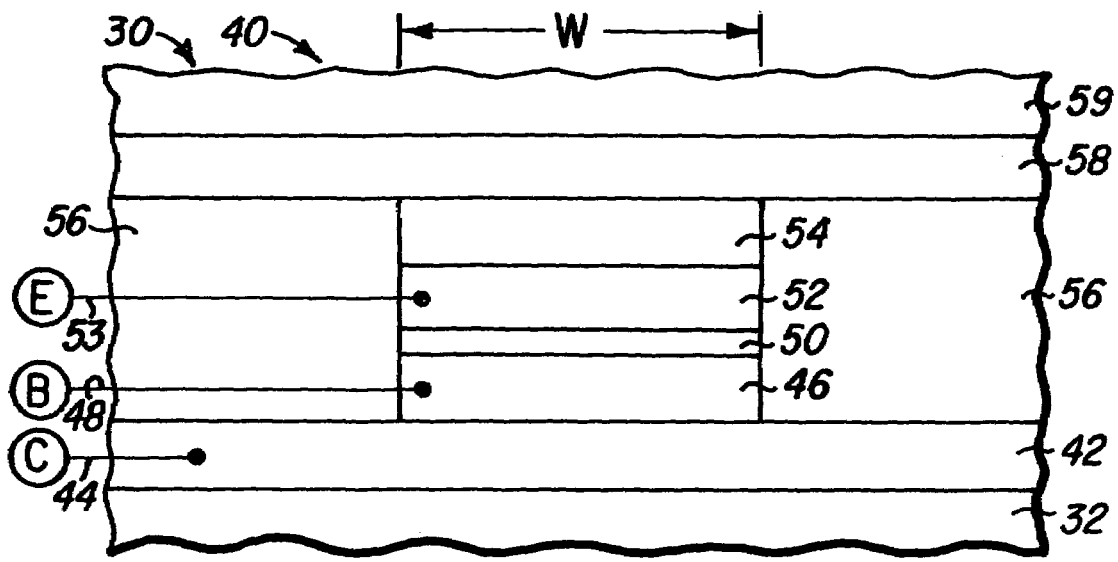
FIG. 3 is an elevational view taken from the air bearing surface of the SVT sensor read head portion of the prior art magnetic head depicted in FIG. 2.
Figure 4:
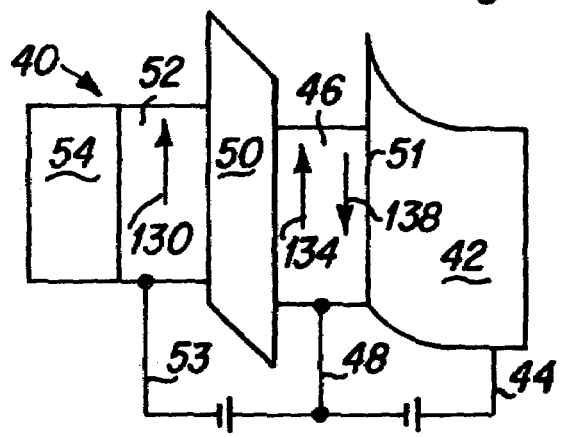
FIG. 4 is a diagram of the prior art SVT sensor depicted in FIG. 3 that is useful for describing its electrical properties.

A typical prior art magnetic head structure is next described with the aid of FIGS. 2-4 to provide a basis for understanding the improvements of the present invention. As will be understood by those skilled in the art, FIG. 2 is a side cross-sectional view that depicts portions of a prior art magnetic head 30, FIG. 3 is an elevational view of a spin valve transistor (SVT) sensor read head portion of the prior art magnetic head 30 depicted in FIG. 2, taken from the air bearing surface of FIG. 2, and FIG. 4 is a diagram of the SVT sensor of FIG. 3 that is useful in describing the electrical properties of the sensor.

As depicted in FIGS. 2 and 3, a typical prior art magnetic head 30 includes a substrate base 32 with a spin valve transistor (SVT) sensor 40, comprising a plurality of layers of specifically chosen materials fabricated thereon. As is best seen in FIG. 3, the SVT sensor 40 is a current perpendicular to the plane (CPP) device, and includes a semiconductor layer 42, typically composed of silicon and having a thickness of approximately 1 μm that is fabricated upon the substrate 32. The semiconductor layer 42 is engaged to a first electrical lead that serves as the collector 44 of the SVT sensor.

A free magnetic layer 46 is next fabricated upon the semiconductor layer 42, and may be comprised of a substance such as NiFe with a thickness of approximately 2 nm. As is well known to those skilled in the art, the free magnetic layer 46 is formed with a magnetization that is free to rotate in the presence of the external magnetic field that emanates from magnetic data bits disposed within the data tracks of the hard disk 12 of the hard disk drive 10. The free magnetic layer 46 is connected to a second electrical lead and serves as the base 48 of the SVT sensor. The metallic free magnetic layer at the face of the semiconductor layer can create an electron barrier, termed a schottky barrier 51, between the base 48 and the collector 44, as is described in detail herebelow. A thin alumina layer 50, which serves as a tunnel barrier layer is next deposited upon the free layer 46 to a thickness of approximately 5 Å to 10 Å. Thereafter, a pinned magnetic layer 52 is fabricated upon the alumina layer 50. The pinned magnetic layer 52 is typically comprised of a magnetic material such as CoFe or NiFe, and is formed with a thickness of approximately 20 nm. The pinned magnetic layer 52 is connected to a third electrical lead that serves as the emitter 53 of the SVT sensor, such that the tunnel barrier 50 is thus disposed between the emitter 53 and the base 48. Thereafter, an antiferromagnetic (AFM) layer 54 is deposited upon the pinned magnetic layer 52, where the AFM layer is typically comprised of a material such as PtMn or IrMn and has a thickness of approximately 15 nm.

The SVT sensor layers are then masked and milled to the read track width W, and insulation material 56 such as alumina is deposited along side the sensor layers, such that the electrical sense current between the emitter, base and collector will flow through the sensor layers. Thereafter, a second magnetic shield (S2) 58 is fabricated upon the AFM layer 54. Alternatively, the AFM layer 54 or the S2 shield 58 may serve as the emitter lead. An electrical insulation layer 59 is then deposited upon the S2 shield 58, and a write head portion of the magnetic head 30 is next fabricated.

As is best seen in FIG. 2, an embodiment of the write head portion of the prior art magnetic head 30 includes a first magnetic pole (P1) 60 that is fabricated upon the insulation layer 59. Following the fabrication of the P1 pole 60, a write gap layer 72 typically composed of a non-magnetic material such as alumina is deposited upon the P1 pole 60. This is followed by the fabrication of a P2 magnetic pole tip 76 and an induction coil structure, including coil turns 80, that is then fabricated within insulation 82 above the write gap layer 72. Thereafter, a yoke portion 84 of the second magnetic pole is fabricated in magnetic connection with the P2 pole tip 76, and through back gap element 90 to the P1 pole 60. Electrical leads (not shown) to the induction coil are subsequently fabricated and a further insulation layer 114 is deposited to encapsulate the magnetic head. The magnetic head 30 is subsequently fabricated such that an air bearing surface (ABS) 116 is created. Alternatively, other write head configurations as are known to those skilled in the art may be fabricated upon the SVT sensor 40.

It is to be understood that there are many detailed features and fabrication steps of the magnetic head 30 that are well known to those skilled in the art, and which are not deemed necessary to describe herein in order to provide a full understanding of the present invention.

FIG. 4 is a diagram of the prior art SVT sensor 40 depicted in FIG. 3 that is useful for describing the electrical properties of the SVT sensor. As depicted therein, the pinned magnetic layer 52 which is engaged to the emitter 53 is shown with a general magnetization (arrow 130) that is shown, for example, in the up direction. This up direction magnetization 130 will generally favor the rapid, easy passage of emitter electrons having an upward spin direction, whereas electrons having a downward spin direction will generally be scattered within the pinned magnetic layer of the emitter. The alumina tunnel barrier layer 50 forms a first barrier for the movement of electrons towards the base and collector. Higher energy electrons, typically with an upward spin, although a lesser percentage with a downward spin, will travel through the barrier layer 50 to the free magnetic layer 46 which is engaged to the base 48 of the SVT sensor. As indicated above, the magnetization of the free magnetic layer 46 rotates due to the influence of the data bit magnetic fields. Where the magnetization of the free magnetic layer is rotated towards the up direction (arrow 134), the electrons having an upward spin travel rapidly and easily through the free magnetic layer. Those electrons having a downward spin are impeded and scattered within the free magnetic layer 46 and form much of the electrical current of the base 48 of the SVT sensor. Where the magnetization of the free magnetic layer is towards the down direction (arrow 138) the opposite effect upon the electron spin and travel of the electrons occurs.

A second barrier in the form of a schottky barrier 51 is created at the interface between the metallic free magnetic layer 46 and the semiconductor layer 42 which is connected to the collector lead 44. The electrons with an upward spin, where the magnetization of the free magnetic layer 46 is up (arrow 134), have the energy to cross the schottky barrier 51 and comprise substantially all of the electrical current at the collector 44 of the SVT sensor. Electrons with a downward spin (where the free magnetic layer magnetization is up) typically lack the energy to get over or through the schottky barrier 51.

It is therefore to be understood that the SVT sensor 40 is formed with two barriers, the tunnel barrier 50 and the schottky barrier 51. Two of the SVT electrical leads, emitter 53 and base 48, are connected to spin valve component layers, the pinned magnetic layer 52 and the free magnetic layer 46 respectively, and one of the SVT leads, the collector lead 44, is engaged to the semiconductor layer 42.

Figure 5:
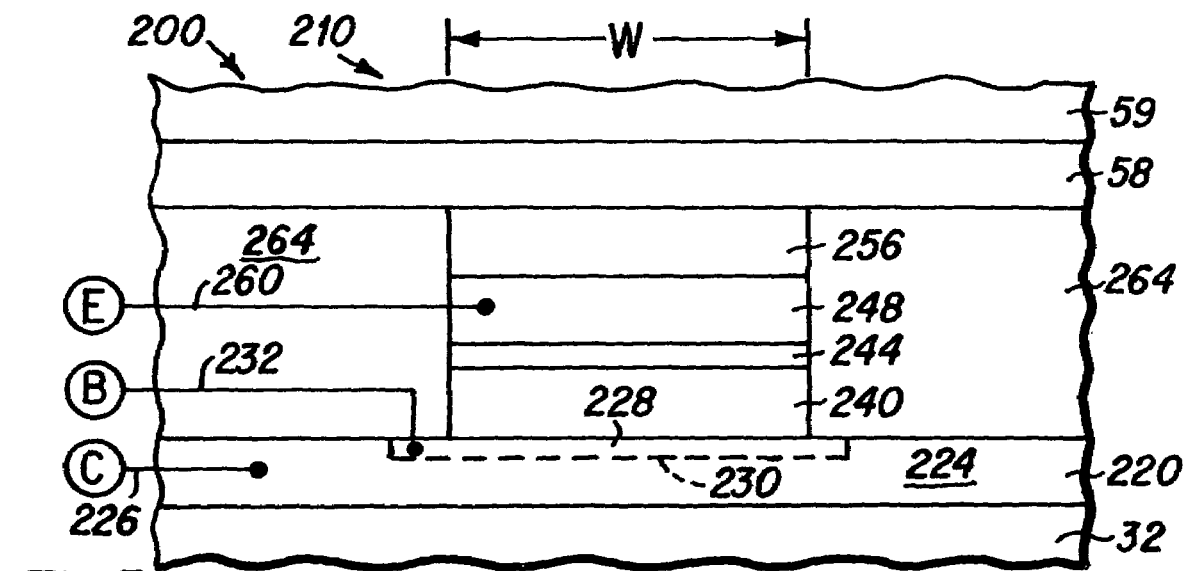
FIG. 5 is an elevational view taken from the air bearing surface depicting a three terminal magnetic (TTM) sensor of the present invention.
Figure 6:
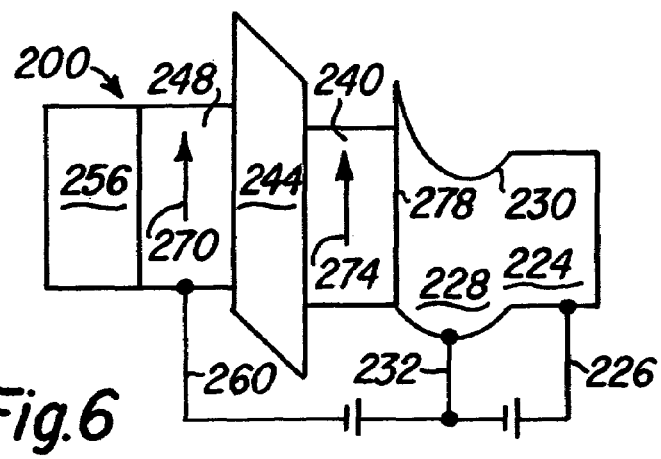
FIG. 6 is a diagram of the TTM sensor depicted in FIG. 7 that is useful for describing its electrical properties.

FIGS. 5 and 6 depict features of a three terminal magnetic (TTM) sensor in the form of an SVT sensor 200 of a magnetic head 210 of the present invention, which can serve as a magnetic head 20 within the hard disk drive 10. FIG. 5 is an elevational view taken from the air bearing surface (similar to the direction of FIG. 3), and FIG. 6 is a diagram that is useful for describing the electrical properties of the SVT sensor 200. As will be understood from the following description, the significant differences between the magnetic head 210 of the present invention and the prior art magnetic head 30 depicted in FIGS. 2-4 relate to the structure of the SVT sensor 200; other features and structures of the magnetic head 210 of the present invention may be similar to those of the prior art.

As depicted in FIG. 5, the magnetic head 210 includes a substrate base 32 with a spin valve transistor (SVT) sensor 200, comprising a plurality of layers of specifically chosen materials fabricated thereon. As is best seen in FIG. 5, the SVT sensor 200 includes a semiconductor layer 220, typically comprised of silicon and having a thickness of approximately 1 μm. The present is not be limited to the silicon semiconductor material, and other semiconductor materials, such as GaAs may be utilized. The semiconductor material 220 is doped with a suitable material such as boron to form a P-type semiconductor layer 224. The P-type semiconductor layer 224 is engaged to a first electrical lead and serves as the collector 226 of the SVT sensor 200.

Upper portions of the P-type semiconductor layer 224 are further doped to become an N-type semiconductor 228 through the addition of a doping material such as phosphorous. An N-P junction 230 is formed at the interface between the N-doped layer 228 and the P-doped layer 224, and the N-type semiconductor layer 228 is engaged to a second electrical lead that serves as the base 232 of the SVT sensor 200.

A free magnetic layer 240 is fabricated upon the N-type semiconductor layer 228, and it may be comprised of a material such as NiFe, with a thickness of approximately 2 nm. The free magnetic layer 240 is formed with a magnetization that is free to rotate in the presence of the external magnetic field that emanates from magnetic data bits disposed within the data track 12 of the hard disk of the hard disk drive 10. A thin alumina layer 244, having a thickness of approximately 5 Å to 10 Å, and which serves as a tunnel barrier layer is next deposited upon the free layer 240. Thereafter, a pinned magnetic layer 248 is fabricated upon the alumina layer 244. The pinned magnetic layer 248 is typically comprised of a magnetic material such as CoFe or NiFe, and is formed with a thickness of approximately 2 nm. Thereafter, an antiferromagnetic (AFM) layer 256 is fabricated upon the pinned magnetic layer 248, where the AFM layer is typically comprised of a material such as IrMn or PtMn and has a thickness of approximately 10-15 nm. The pinned magnetic layer 248 (or AFM layer 256) is connected to an electrical lead that serves as the emitter 260 of the SVT sensor 200.

The SVT sensor layers are then masked and shaped to the read track width W, and insulation material 264 such as alumina is deposited along side the sensor layers, such that the electrical sense current between the emitter, base and collector will flow through the sensor layers. Thereafter, a second magnetic shield (S2) 58 is fabricated upon the AFM layer 256. Alternatively, the S2 shield 58 may serve as the emitter lead. An electrical insulation layer 59 is then deposited upon the S2 shield 58, and a write head portion of the magnetic head 210 is next fabricated as has been described above with the aid of FIG. 2. The write head portion may be fabrication in other well known configurations as are known to those skilled in the art.

It is to be understood that there are many detailed features and fabrication steps of the magnetic head 210 that are well known to those skilled in the art, and which are not deemed necessary to describe herein in order to provide a full understanding of the present invention.

FIG. 6 is a diagram of the SVT sensor 200 depicted in FIG. 5 that is useful for describing its electrical properties. As depicted therein, the pinned magnetic layer 248 which is engaged to the emitter 260 is shown with a general magnetization in the up direction (arrow 270). This up direction magnetization will generally favor the rapid, easy passage of electrons having an upward spin direction, whereas electrons having a downward spin direction will generally be scattered within the pinned magnetic layer of the emitter 260. The alumina tunnel barrier layer 244 forms a first barrier that controls the movement of electrons towards the base and collector. Electrons, typically with an upward spin will have greater probability of travel through the tunnel barrier 244 and the free magnetic layer 240, although a lesser percentage of electrons with a downward spin will have a greater probability of being scattered before traveling through the tunnel barrier 244 and the free magnetic layer 240. As indicated above, the magnetization of the free magnetic layer rotates due to the influence of the data bit magnetic fields. Where the magnetization of the free magnetic layer 240 is towards the up direction (see arrow 274), the electrons having an upward spin travel rapidly and easily through the free magnetic layer 240. Electrons having a downward spin are impeded and scattered within the free magnetic layer. A second barrier 278 in the form of a schottky barrier is formed at the interface between the metallic free magnetic layer 240 and the N-type semiconductor material 228 which is connected to the base 232. The electrons with an upward spin have the energy to cross the schottky barrier 278, where a lesser percentage of downward spin electrons can pass over or through the schottky barrier. Thereafter, the electrons travel from the N-type semiconductor 228 to the P-type semiconductor 224, and a third barrier exists at the junction 230 between the N and P type semiconductor layers 228 and 224. Electrons with sufficient energy to cross the N-P junction barrier 230 will be collected at the collector 226 as the collector current, while electrons without sufficient energy will form the current at the base lead 232 from the N-type semiconductor layer 228.

It is therefore to be understood that the SVT sensor is 200 formed with three barriers, the tunnel barrier 244, the schottky barrier 278 and the N-P junction barrier 230. Two of the SVT electrical leads, the base 232 and the collector 226, are connected to semiconductor component layers, the N-type semiconductor layer 228 and the P-type semiconductor layer 224 respectively, and one of the SVT leads, the emitter lead 260, is engaged to the spin valve at the AFM layer 256 or pinned magnetic layer 248. The emitter 260 thus can be said to be connected to the spin valve structure, and the base and collector are connected to layers of the semiconductor 220.

Figure 7:
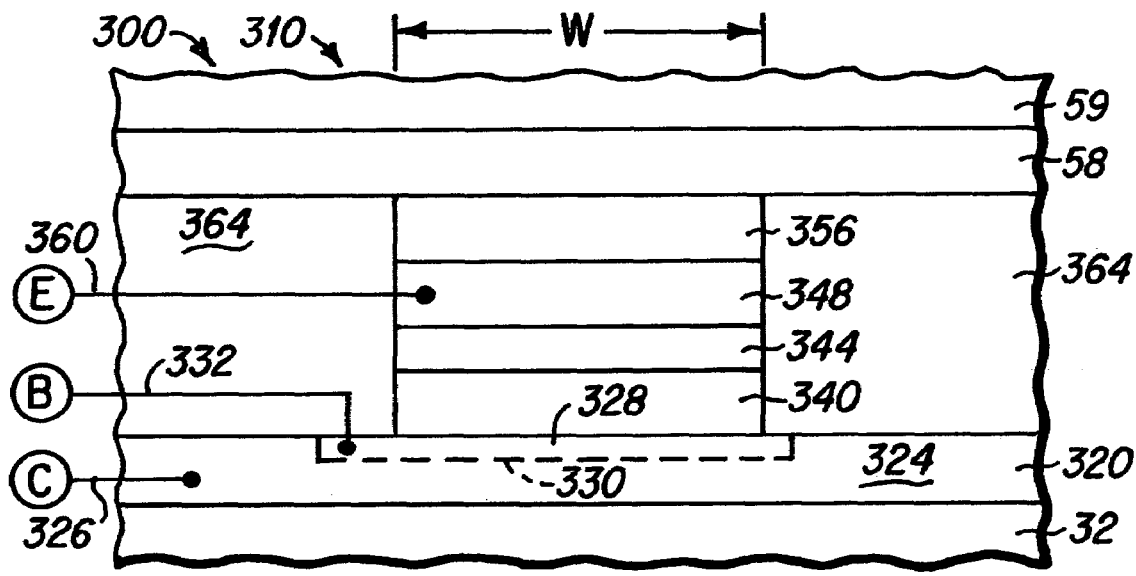
FIG. 7 is an elevational view taken from the air bearing surface depicting another TTM sensor of the present invention.
Figure 8:
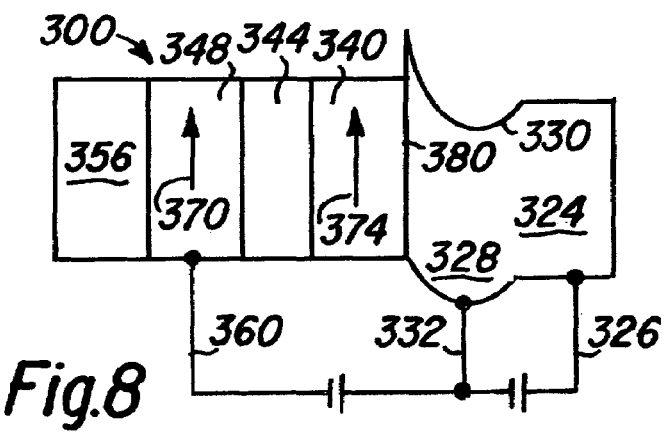
FIG. 8 is a diagram of the TTM sensor depicted in FIG. 7 that is useful for describing its electrical properties.

FIGS. 7 and 8 depict features of another three terminal magnetic (TTM) sensor device in the form of an SVT sensor 300 of a magnetic head 310 of the present invention, which can serve as the magnetic head 20 in the hard disk drive 10, where FIG. 7 is an elevational view taken from the air bearing surface (similar to the direction of FIGS. 3 and 5), and FIG. 8 is a diagram that is useful for describing the electrical properties of the SVT sensor 300. As will be understood from the following description, the significant differences between the magnetic head 310 of the present invention and the prior art magnetic head 30 depicted in FIGS. 2-4 relate to the structure of the SVT sensor 300; other features and structures of the magnetic head 310 of the present invention may be similar to those of the prior art.

As depicted in FIG. 7, the magnetic head 310 includes a substrate base 32 with a spin valve transistor (SVT) sensor 300, comprising a plurality of layers of specifically chosen materials formed thereon. As is best seen in FIG. 7, the SVT sensor 300 includes a semiconductor layer 320, typically comprised of silicon and having a thickness of approximately 1 μm. The semiconductor material 320 is doped with a suitable material to form a P-type semiconductor layer 324, and suitable doping material is boron. The P-type semiconductor layer 324 is engaged to a first electrical lead and serves as the collector 326 of the SVT sensor.

Upper portions of the P-type semiconductor layer 324 are further doped to become an N-type semiconductor 328 through the addition of a doping material such as phosphorous. An N-P junction 330 is formed at the interface between the N-doped layer 328 and the P-doped layer 324, and the N-type semiconductor layer 328 is engaged to a second electrical lead that serves as the base 332 of the SVT sensor 300.

A free magnetic layer 340 is fabricated upon the N-type semiconductor layer 328, and it may be comprised of a material such as NiFe with a thickness of approximately 2 nm. The free magnetic layer 340 is formed with a magnetization that is free to rotate in the presence of the external magnetic field that emanates from magnetic data bits disposed within the data track 12 of the hard disk of the hard disk drive 10. A nonmagnetic, electrically conductive spacer layer 344, typically comprised of Cu or Ru and having a thickness of approximately 1 nm, is next deposited upon the free layer 340. Thereafter, a pinned magnetic layer 348 is fabricated upon the spacer layer 344. The pinned magnetic layer 348 is typically comprised of a magnetic material such as CoFe or NiFe, and is formed with a thickness of approximately 2 nm. An antiferromagnetic (AFM) layer 356 is next fabricated upon the pinned magnetic layer 348, where the AFM layer is typically comprised of a material such as IrMn or PtMn and has a thickness of approximately 10-15 nm. The pinned magnetic layer 348 (or AFM layer 356) is connected to an electrical lead that serves as the emitter 360 of the SVT sensor 300.

The SVT sensor layers are then masked and shaped to the read track width W, and insulation material 364 such as alumina is deposited along side the sensor layers, such that the electrical sense current between the emitter, base and collector will flow through the sensor layers. Thereafter, a second magnetic shield (S2) 58 is fabricated upon the AFM layer 356. Alternatively, the S2 shield 58 may serve as the emitter lead. An electrical insulation layer 59 is then deposited upon the S2 shield 58, and a write head portion of the magnetic head 310 is next fabricated as has been described above with the aid of FIG. 2. The write head portion may be fabrication in other well known configurations as are known to those skilled in the art.

It is to be understood that there are many detailed features and fabrication steps of the magnetic head 310 that are well known to those skilled in the art, and which are not deemed necessary to describe herein in order to provide a full understanding of the present invention.

FIG. 8 is a diagram of the SVT sensor 300 depicted in FIG. 7 that is useful for describing its electrical properties. As depicted therein, the pinned magnetic layer 348 which is engaged to the emitter 360 is shown with a general magnetization in the up direction (arrow 370). This tip direction magnetization will generally favor the rapid, easy passage of electrons having an upward spin direction, whereas electrons having a downward spin direction will generally be scattered within the pinned magnetic layer of the emitter 360. The spacer layer 344 then allows the travel of electrons therethrough to the free magnetic layer 340. As indicated above, the magnetization of the free magnetic layer 340 rotates due to the influence of the data bit magnetic fields. Where the magnetization of the free magnetic layer 340 is towards the up direction (see arrow 374), the electrons having an upward spin travel rapidly and easily through the free magnetic layer 340. Electrons having a downward spin are impeded and scattered within the free magnetic layer. A first barrier in the form of a schottky barrier 380 is formed at the interface between the metallic free magnetic layer 340 and the N-type semiconductor material 328 which is connected to the base 332. The electrons with an upward spin have the energy to cross the schottky barrier 380, where a lesser percentage of downward spin electrons can pass over or through the schottky barrier. Thereafter, the electrons travel from the N-type semiconductor to the P-type semiconductor, and a second barrier exists at the junction 330 between the N and P type semiconductor layers. Electrons with sufficient energy to cross the N-P junction barrier 330 will be collected at the collector 326 as the collector current, while electrons without sufficient energy will form the current at the base 332 from the N-type semiconductor layer 328.

It is therefore to be understood that the SVT sensor is 300 formed with two barriers, the schottky barrier 380 and the N-P junction barrier 330. Two of the SVT electrical leads, the base 332 and the collector 326, are connected to semiconductor material layers, the N-type semiconductor layer 328 and the P-type semiconductor layer 324 respectively, and one of the SVT leads, the emitter lead 360, is engaged to the spin valve AFM or pinned magnetic layer 348. The emitter thus can be said to be connected to the spin valve structure, and the base and collector are connected to layers of the semiconductor material.

Figure 9:
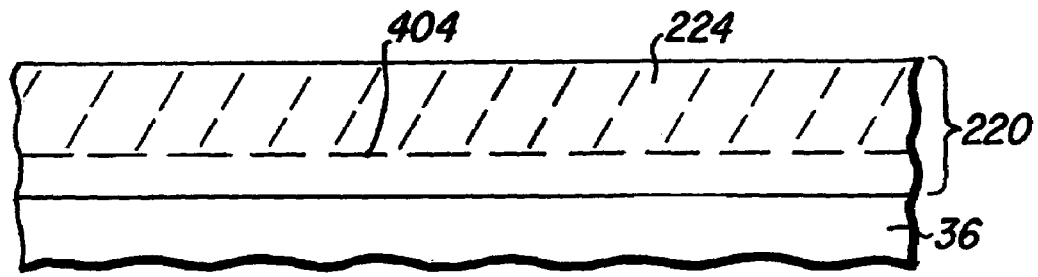
FIGS. 9, 10, 11 and 12 depict process steps for the fabrication of the TTM sensor of the magnetic head of the present invention.
Figure 10:
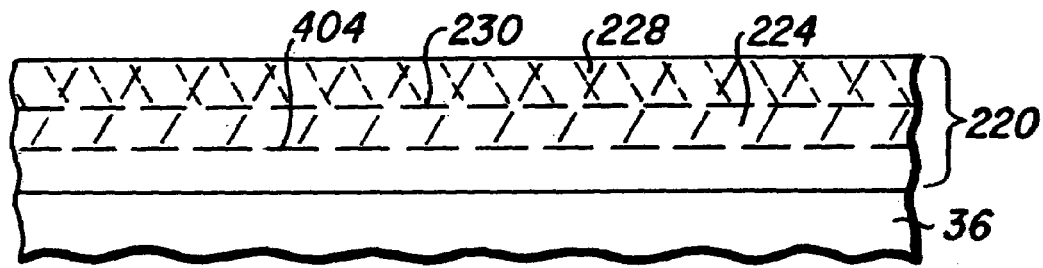

Process steps for fabricating the SVT sensor of the magnetic head of the present invention are next described with the aid of FIGS. 9-12. As depicted in FIG. 9 and with reference to the magnetic head embodiment 210 depicted in FIGS. 5 and 6, a semiconductor substrate layer 220 is deposited upon or bonded to the surface of the substrate 32 utilizing sputter deposition or similar well known techniques. Alternatively the semiconductor substrate may comprise the substrate 32 and be separate from the substrate as part of a silicon on insulator (SOI) process as is known to those skilled in the art. The semiconductor substrate 220 may be comprised of various semiconductor materials such as silicon and gallium arsenide, and/or a silicon on insulator (SOI) layered structure. The semiconductor substrate layer having a thickness of approximately 1 µm is then doped, preferable with a P dopant such as boron to a depth 404 of at least approximately 0.2 µm within the substrate layer 220. Thereafter, as depicted in FIG. 10, the P-doped semiconductor layer 224 is exposed to an N-doping process to achieve a relatively shallow N-doped surface layer 228 portion having a thickness of at least approximately 0.1 µm within the P-doped semiconductor. The quantity of N-dopant such as phosphorous exceeds that of the P-dopant in the relatively shallow layer 228, such that the layer acts as an N-doped layer 228 and there is a P-N junction 230 between the P-doped layer 224 and the N-doped layer 228. Process techniques for P and N doping the semiconductor substrate are well known to those skilled in the art and a detailed description thereof is not deemed necessary for an understanding of the present invention.

Figure 11:
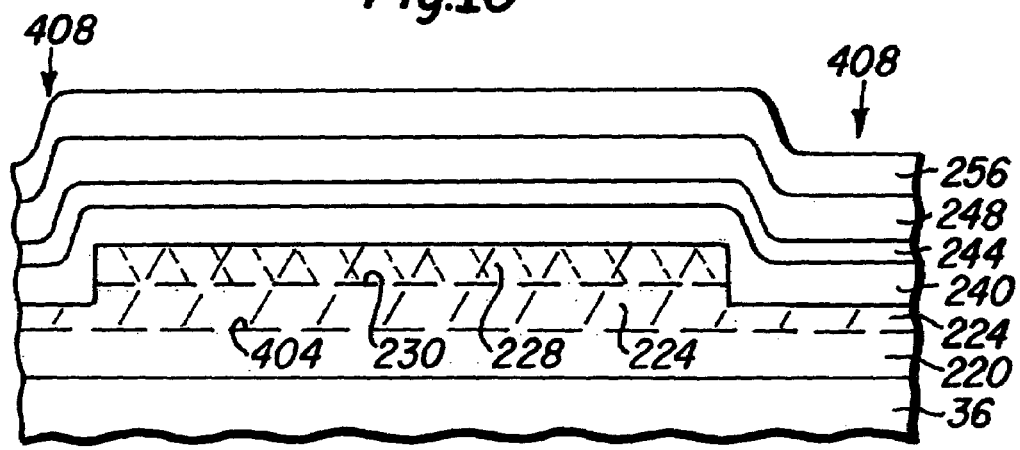
Figure 12:
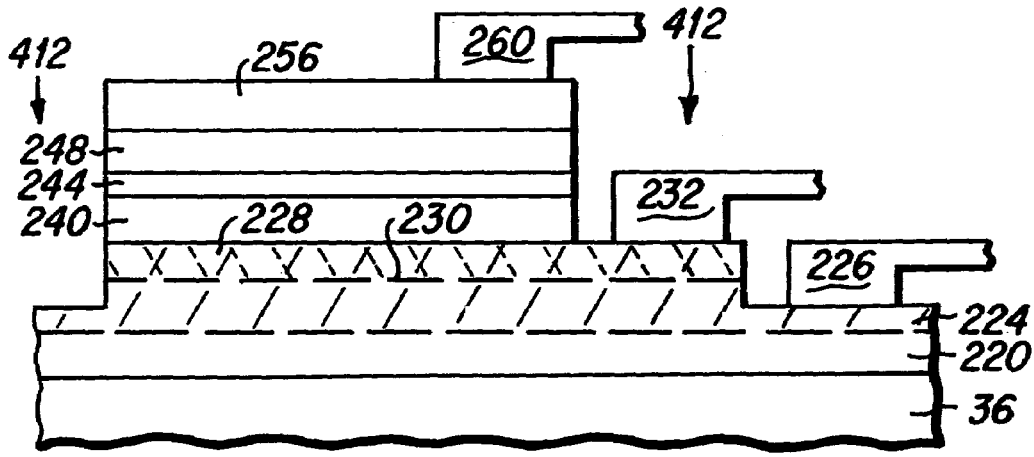

Thereafter, as depicted in FIG. 11, a central portion of the semiconductor layer is masked, followed by a material removal step, such as a sputter etching or ion milling step, in which the outer portions 408 of the semiconductor substrate are removed, down through the P-N junction 230 and into the P-doped semiconductor layer 224. Thereafter, the various layers of materials that comprise the spin valve sensor are deposited upon the substrate. As indicated hereabove, the spin valve layers may include a free magnetic layer 240, a tunnel barrier layer 244 or a spacer layer, a pinned magnetic layer 248 and an antiferromagnetic layer 256. Thereafter, a further mask is fabricated to protect the centrally located spin valve layers, and outer portions 412 of the spin valve layers are removed, such as by sputter etching, ion milling or other material removal techniques. Thereafter, electrical interconnect leads are fabricated to the various layers; particularly, a collector lead 226 is fabricated in connection with the P-doped semiconductor layer 224, a base lead 232 is fabricated in connection with the N-doped semiconductor layer 228 and the emitter lead 260 is fabricated in connection with the upper layers of the spin valve structure, such as the antiferromagnetic layer 256.

The thickness and doping levels of the N-type semiconductor layer 228 can be controlled with thermal annealing and diffusion techniques to diffuse the N-type semiconductor dopant material into the surface of a P-type semiconductor 224. The barrier 230 between the N and P-type can be modified by the semiconductor doping levels or by a biasing voltage on the N-type semiconductor or the P-type semiconductor. The area of overlap between the N-doped semiconductor layer 228 and P-doped semiconductor layer 224 is desirably minimized because if the N-type layer 228 has a very large area over the P-type layer 228 then basically it can cause excessive current leakage from the N-type semiconductor to the P-type semiconductor; so the overlap area of the N-type layer 228 on the P-type layer 224 should be minimized. It is also to be noted that the order of N-type semiconductor on P-type semiconductor can be reversed in the present invention. Therefore a TTM sensor of the present invention can have a P-N junction or a N-P junction therein.

While the present invention has been shown and described with regard to certain preferred embodiments, it is to be understood that modifications in form and detail will no doubt be developed by those skilled in the art upon reviewing this disclosure. It is therefore intended that the following claims cover all such alterations and modifications that nevertheless include the true spirit and scope of the inventive features of the present invention.

What I claim is:

1. A method for fabricating a three terminal magnetic (TTM) sensor of a magnetic head, comprising:
    fabricating a P-type semiconductor material;
    fabricating an N-type semiconductor material at an upper surface of a portion of said P-type semiconductor material;
    fabricating a spin valve structure upon said N-type semiconductor material;
    engaging a collector lead to said P-type semiconductor material;
    engaging a base lead to said N-type semiconductor material; and
    engaging an emitter lead to said spin valve structure.

2. The method for fabricating a TTM sensor as described in claim 1, including the steps of fabricating a schottky barrier between said N-type semiconductor material and said spin valve structure.

3. The method for fabricating a TTM sensor as described in claim 1, wherein said step of fabricating an N-type semiconductor material includes the steps of doping an upper layer of said P-type semiconductor material to create said N-type semiconductor material.

* * * * *